United States Patent [19]

Snail et al.

[11] Patent Number: 5,527,392
[45] Date of Patent: Jun. 18, 1996

[54] SUBSTRATE TEMPERATURE CONTROL APPARATUS FOR CVD REACTORS

[75] Inventors: Keith A. Snail, Silver Spring, Md.; Thomas P. Thorpe, Alexandria, Va.

[73] Assignee: The United States of America as represented by the Secretary of the Navy, Washington, D.C.

[21] Appl. No.: 213,210

[22] Filed: Mar. 15, 1994

Related U.S. Application Data

[62] Division of Ser. No. 62,889, May 18, 1993, Pat. No. 5,318,801.

[51] Int. Cl.[6] .................................................. C23C 16/00
[52] U.S. Cl. ............................ 118/725; 118/724; 118/728
[58] Field of Search .................................. 118/724, 725, 118/728

[56] References Cited

U.S. PATENT DOCUMENTS

| | | | |
|---|---|---|---|
| 4,047,496 | 9/1977 | McNeilly | 118/725 |
| 4,654,509 | 3/1987 | Robinson | 219/405 |
| 4,938,940 | 7/1990 | Hirose et al. | 427/34 |
| 4,996,942 | 3/1991 | deBoer | 118/730 |
| 5,033,407 | 7/1991 | Mizuno | 118/715 |
| 5,044,943 | 9/1991 | Bowman | 118/725 |
| 5,068,871 | 11/1991 | Uchida et al. | 373/17 |
| 5,108,792 | 4/1992 | Anderson | 118/725 |
| 5,182,093 | 1/1993 | Cann | 423/446 |
| 5,188,058 | 2/1993 | Nakai | 118/725 |
| 5,314,540 | 5/1994 | Nakamura | 118/723 DC |

FOREIGN PATENT DOCUMENTS

| | | | |
|---|---|---|---|
| 3633386 | 4/1988 | Germany . | |
| 60-136314 | 7/1985 | Japan | 118/728 |

*Primary Examiner*—Richard Bueker
*Attorney, Agent, or Firm*—Thomas E. McDonnell; Ajay S. Pathak

[57] ABSTRACT

One of the critical experimental parameters affecting the quality and growth rate of chemical vapor deposition species, such as, diamond is the substrate temperature. An apparatus and technique for the precise control of the substrate temperature in a chemical vapor deposition environment has been developed. In a preferred embodiment, the technique uses a variable gas mixture in conjunction with the disclosed apparatus of the present invention to precisely control the temperature of the substrate to within at least ±20° C. for extended periods of time and over large area substrates on the order of 1" in diameter or larger.

24 Claims, 6 Drawing Sheets

SUBSTRATE TEMPERATURE CONTROL APPARATUS FOR CVD REACTORS

CROSS REFERENCE TO RELATED APPLICATION

This application is a divisional application of copending parent application (pursuant to 37 CFR § 1.60) having Ser. No. 08/062,889, filed on 18 May 1993 and entitled, SUBSTRATE TEMPERATURE CONTROL APPARATUS AND TECHNIQUE FOR CVD REACTORS.

BACKGROUND OF THE INVENTION

1. Field of the Invention

The present invention relates generally to high heat load processes, for example, chemical vapor deposition (CVD) and more specifically to an apparatus for precisely controlling the temperature of a substrate during such high heat load processes.

2. Description of the Related Art

The current interest in chemical vapor deposition (CVD) of diamond can be traced to work in the early 1980's which showed that activating a hydrogen-hydrocarbon mixture with a hot filament could generate diamond growth rates in the 1 μm/hr range. Today, growth rates for optical quality diamond films are about 2–4 μm/hr. At such growth rates, fabrication of bulk diamond windows on the order of 10 cm in diameter and 1 mm thick can require greater than 500 hours or nearly 21 days.

Most CVD processes occur at high temperatures on the order of about 200°–2000° C. CVD processes include oxygen-acetylene flame CVD processes, atmospheric pressure plasma CVD processes, lower heat flux CVD processes, microwave assisted CVD processes and filament assisted CVD processes. In the field of diamond growth by flame CVD, for example, a diamond substrate or a non-diamond substrate is held within an oxygen-acetylene flame in order to promote the deposition of diamond on the substrate in a hydrogen and hydrocarbon rich atmosphere. The temperature of the substrate is regulated between 200°–2000° C. while the diamond grows during the CVD process. Typically, the substrate temperature is difficult to control with precision. Due to the high heat loads used, for example, in excess of 1 kW/cm$^2$, it is difficult to control with precision the temperatures between 200°–2000° C. at the substrate or at the substrate mount and it is difficult to prevent the substrate from overheating. The lack of precise temperature control at the substrate or at the substrate mount during high heat load processes such as the chemical vapor deposition of, for example, diamond is due to a deficiency in the control over thermal heat conduction carrying heat away from the substrate attached to the substrate mount.

One of the critical experimental parameters affecting the quality, for example, the growth of graphite instead of diamond, is the substrate temperature, which, in the case of homoepitaxy, is the seed crystal temperature. In CVD processes, a substrate mount rod with a pre-attached diamond substrate, seed crystal diamond substrate or non-diamond substrate may be used. Alternatively, no such pre-attached substrate mount need be used, in which case, the bare upper surface of the substrate mount rod is itself referred to as the substrate. Most CVD reactors operate between 200°–2000° C., wherein such high heat loads require active cooling of the substrate in order to maintain a desired temperature. The substrate temperature can be adjusted by varying the CVD reactor's power level; however, varying the power level tends to change the gas phase deposition chemistry within the reactor, thus altering the growth conditions and the material properties of the diamond grown.

Changing the coolant flow rate to the substrate mount housing (the heat sink) does not give much dynamic precision control over the desired temperature range, especially in high growth rate processes employing an oxygen-acetylene torch or an atmospheric pressure plasma torch. Nor does the use of other types of heat sinks provide any better precision control of the substrate temperature. Other types of heat sinks include spray coolers, closed loop heat transfer oil systems and heat pipes which can all be substituted for a fluid cooled substrate mount housing, for example, a water cooled copper housing. While several groups have tried inserting thermal resistors between a water cooled housing (substrate mount holder) and the substrate mount, such an apparatus does not provide dynamic precision control during high heat load processes such as CVD. In addition, such techniques do not provide precision temperature control with uniformity over large area substrates.

With the substrate attached to a molybdenum rod (substrate mount), a molybdenum rod threaded into a water cooled housing (substrate mount holder) has been used to control the temperature at the substrate during CVD. The rod can be screwed into or out of the water cooled housing as needed to control the magnitude of heat transfer away from the substrate, which, in turn, controls the temperature of the substrate during CVD. While varying the degree of exposure of the molybdenum rod out of the water cooled housing alters the resistance of the thermal pathway between the substrate and the water cooled housing, this technique cannot control substrate temperature with precision or control substrate temperature with uniformity over a large area substrate. This technique uses the mechanical motion of an object (substrate mount rod), typically, at 900°–1400° C., wherein precise temperature control is difficult to maintain. For example, after about one hour of growth in air, using a threaded molybdenum rod as a substrate mount rod, the molybdenum oxidizes to molybdenum oxide on the rod's threads. Subsequently, it becomes difficult or impossible to rotate the molybdenum rod either into or out of the water cooled housing. As a result, the temperature of the substrate and the substrate mount cannot be controlled with the precision desired.

SUMMARY OF THE INVENTION

It is therefore an object of the claimed invention to control substrate temperature with precision during high heat load processes, for example, chemical vapor deposition, independent of a CVD reactor's power level.

It is another object of the present invention to reliably control substrate temperature with precision during high heat load processes, for example, chemical vapor deposition, over extended periods of time.

It is yet another object of the present invention to uniformly control the substrate temperature during high heat load processes over large area plate-shaped substrates.

These and other objects are achieved by the use of an apparatus in which a gas or a gas mixture is flowed to the heat sink in a space between the substrate mount and a heat sink to promote the transfer of heat from the substrate and substrate mount.

These and other objects and advantages of the invention may be readily ascertained by referring to the following detailed description and examples of the preferred embodiments.

BRIEF DESCRIPTION OF THE DRAWINGS

A more complete appreciation of the present invention and several of the accompanying advantages thereof will be readily obtained by reference to the following detailed description when considered in conjunction with the accompanying drawings, wherein.

DETAILED DESCRIPTION OF THE PREFERRED EMBODIMENTS

The following detailed description of the preferred embodiments is provided to aid those skilled in the art in practicing the present invention. However, the following detailed description of the preferred embodiment should not be construed to unduly limit the present invention. Variations and modification in the embodiments discussed may be made by those of ordinary skill in the art without departing from the scope of the present invention.

Figure 1:
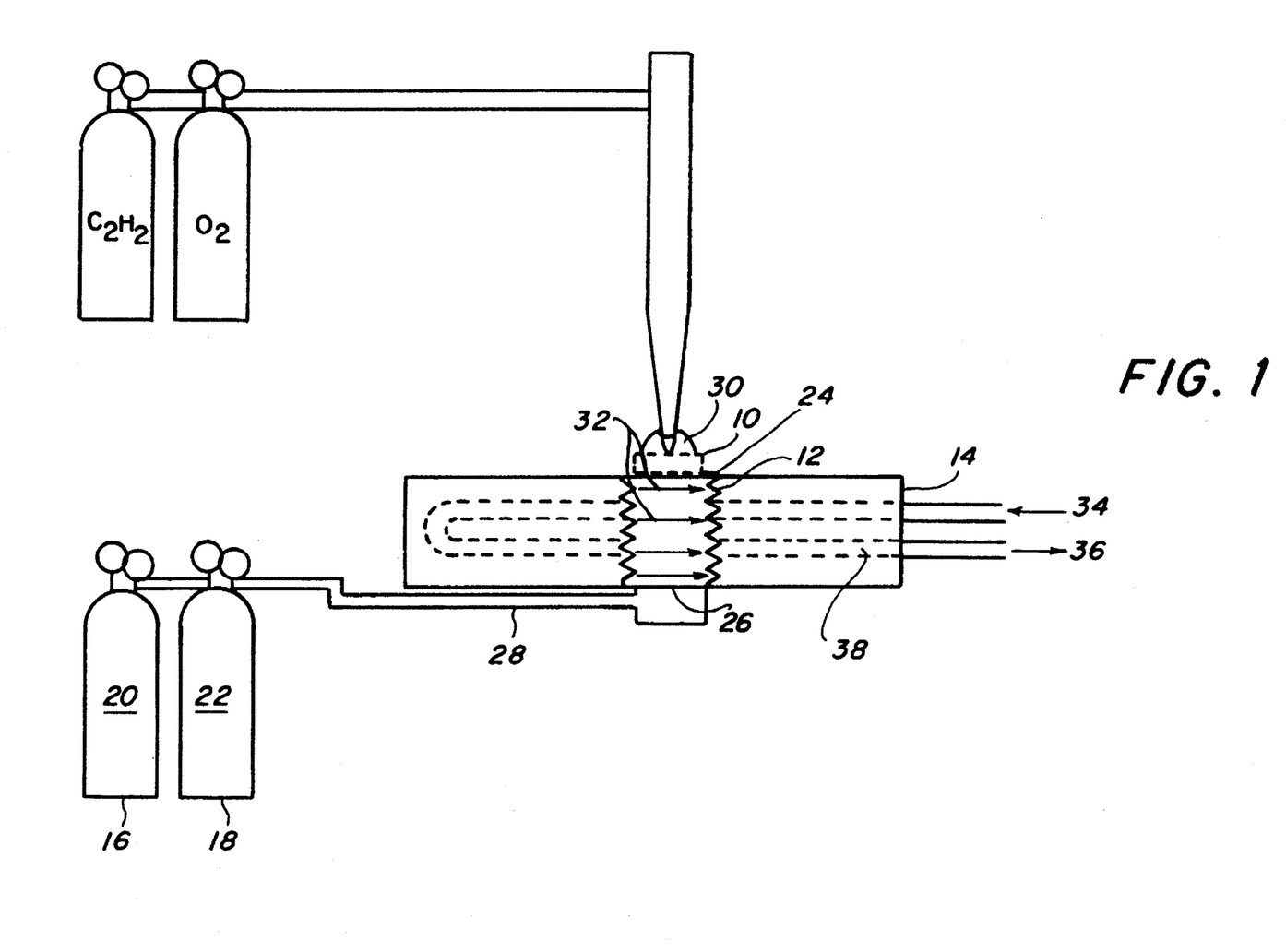
FIG. 1 is a vertical cross-sectional view of an apparatus representative of a first preferred embodiment according to the present invention.

FIG. 1 shows a vertical cross-sectional view of an apparatus for the synthesis of, for example, diamond via chemical vapor deposition on a substrate seed crystal 10 (optional) attached to a substrate mount rod 12, in this case made of molybdenum. In the case of non-homoepitaxial growth, no additional substrate 10 need be pre-attached to the substrate mount rod 12. In such a case, the bare upper surface 24 of the substrate mount rod 12 also serves as substrate. To initiate chemical vapor deposition growth, a substrate seed crystal 10 may be attached to the substrate mount rod 12 via, typically, an appropriate brazing material. Alternatively, diamond can be directly grown, for example by CVD, on the bare substrate mount rod upper surface without using a pre-attached seed crystal.

Figure 2:
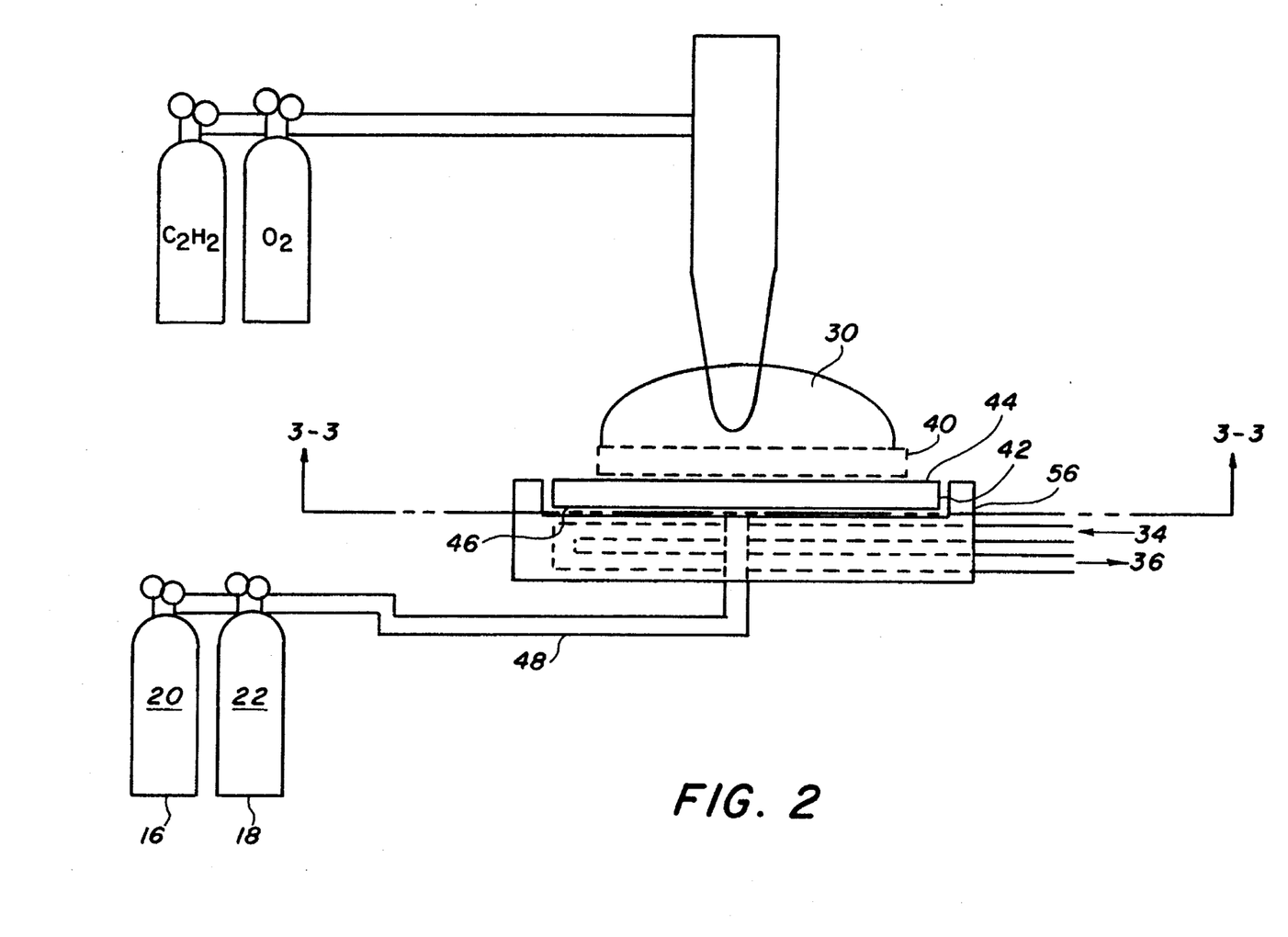
FIG. 2 is another preferred embodiment of the present invention.

FIG. 2 shows a vertical cross-sectional view of an second preferred embodiment of an apparatus for the synthesis of, for example, diamond via chemical vapor deposition on a substrate seed crystal 40 (optional) attached to a substrate mount disk 42, in this case made of molybdenum. In the case of non-homoepitaxial growth, no additional substrate 40 need be pre-attached to the substrate mount disk 42. In such a case, the bare upper surface 44 of the substrate mount disk 42 also serves as substrate. To initiate chemical vapor deposition growth, a substrate seed crystal may be attached to the substrate mount disk 42 via, typically, an appropriate brazing material. Alternatively, diamond can be grown, for example by CVD, on the bare substrate mount disk upper surface without using a pre-attached seed crystal.

The substrate mount rod 12 (FIG. 1 ) or substrate mount disk 42 (FIG. 2) may be made from materials that have melting points above the temperatures at which chemical vapor deposition of the deposition species, for example, diamond is carried out. Generally such materials should be stable between 200°–2000° C. The materials selected from which the substrate mount rod 12 (FIG. 1 ) or substrate mount disk 42 (FIG. 2) are manufactured are those that have thermal conductivities which allow the temperature at the substrate to be precisely controlled between about 200°–2000° C. as desired. Precision temperature control to at least about ±20° C., about ±10° C., about ±5° C., about ±2° C., and about ±1° C. between about 200°–2000° C. has been achieved with the present invention.

In the first and second preferred embodiments, the materials from which the substrate mount rod 12 (FIG. 1) or the substrate mount disk 42 (FIG. 2) may be manufactured, typically, have a thermal conductivity of about 0.05–32 W/cm-°K. at 273° K. The intermediate and preferred ranges for the thermal conductivity of materials from which the substrate mount rod 12 (FIG. 1 ) or substrate mount disk 42 (FIG. 2) may be manufactured are about 0.6–32 W/cm-°K. and about 1.0–32 W/cm-°K., respectively, at 273° K. The substrate mount rod 12 or substrate mount disk 42 (FIG. 2) is typically made of a refractory material. Suitable refractory materials include, for example, graphite, molybdenum, sapphire, diamond, alumina, tungsten, titanium, niobium, beryllium oxide and mixtures thereof.

The substrate mount rod 12, in the first preferred embodiment, extends through a heat sink made of a thermally conductive material 14. The substrate mount disk 42, in the second preferred embodiment, is laid into a cavity cut within the heat sink 56 as shown in FIG. 2. In the first preferred embodiment, the substrate mount rod 12 is threaded into the heat sink 14. The upper surface 24 of the substrate mount rod 12 (FIG. 1) or the upper surface 44 of the substrate mount disk 42 (FIG. 2) is the surface upon which the deposition species is grown or upon which a seed crystal is pre-attached to the upper surface 24 of substrate mount rod 12 (FIG. 1) or to upper surface 44 of substrate mount disk 42 (FIG. 2) via an appropriate brazing material. The lower surface 26 of the substrate mount rod 12 (FIG. 1 ) or lower surface 46 of substrate mount disk 42 (FIG. 2) is connected to a tube 28 (FIG. 1 ) or tube 48 (FIG. 2) connected to one or more tanks, for example, 16 and 18, containing one or more gases, for example, 20 and 22, respectively.

Referring to FIG. 1, during, for example, the chemical vapor deposition of the deposition species onto substrate 10 or directly onto the upper surface 24 or onto a seed crystal, the temperature of the upper surface of the substrate must be controlled with precision between about 200°–2000° C. In order to maintain precision control of the temperature of the substrate being subjected to high heat load from, for example, flame 30 during CVD, pressurized tanks (e.g. 16 and 18) release one or more gases, for example, 20 and 22, into tube 28. If two or more gases are used, then they mix as they flow through tube 28 toward the lower surface 26 of the substrate mount rod 12. For the sake of convenience, the present invention is described here with respect to the use of a mixed gas flow, it being understood that a single gas may instead be used. The mixed gases flow from tanks 16 and 18 into tube 28 through the threaded gap interface 32 between the substrate mount rod 12 and the heat sink 14. The mixed gases flow from the lower surface 26 of the substrate mount rod 12 towards the upper surface 24. The mixed gases flow through the threaded gap interface 32 and exit at the upper surface 24 into, for example, the CVD chamber depicted in FIG. 1. The gas flow through the threaded gap interface 32 carries heat away from the substrate mount rod 12 and the substrate. This removal of heat from the substrate via the one or more gases, for example, 20 and 22, precisely controls the substrate temperature during high heat load processes where heat loads in excess of 1 kW/cm² are commonly used, such as CVD. Preferably, a gas mixture contains one gas with a higher thermal conductivity than the other gas or gases. The thermal conductivities of various gases are given below:

| Thermal Conductivity of Gases at 50° C. | | |
|---|---|---|
| | (Cal/cm-s-°C.) × 10⁻⁶ | (W/cm-°K.) × 10⁶ |
| Nitrogen | 65.7 | 274.9 |
| Argon | 45.5 | 190.4 |
| Helium | 376 | 1573 |
| Hydrogen | 471 | 1971 |

Figure 4:
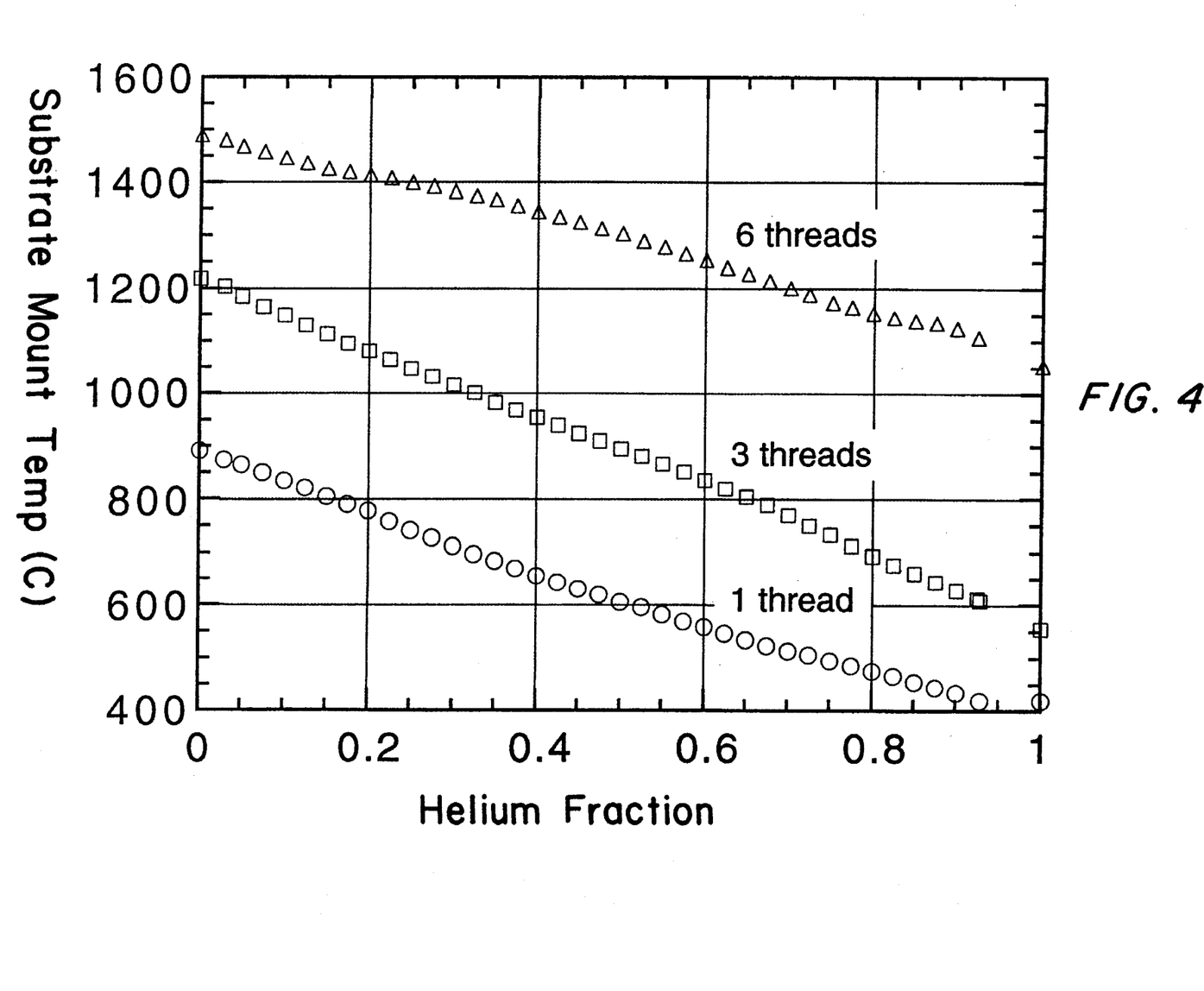
FIG. 4 is a plot of the molybdenum mount rod (substrate mount) temperature (°C.) versus helium (He) gas fraction using the first preferred embodiment of the present invention (apparatus of FIG. 1) wherein total gases consist of helium (He) and argon (Ar) and total gas flow rate was 200 sccm (standard $cm^3$/minute) through the threaded interface between the water cooled housing (substrate mount holder) and the molybdenum rod (substrate mount) and wherein the number of threads exposed above the water cooled housing are indicated.
Figure 5:
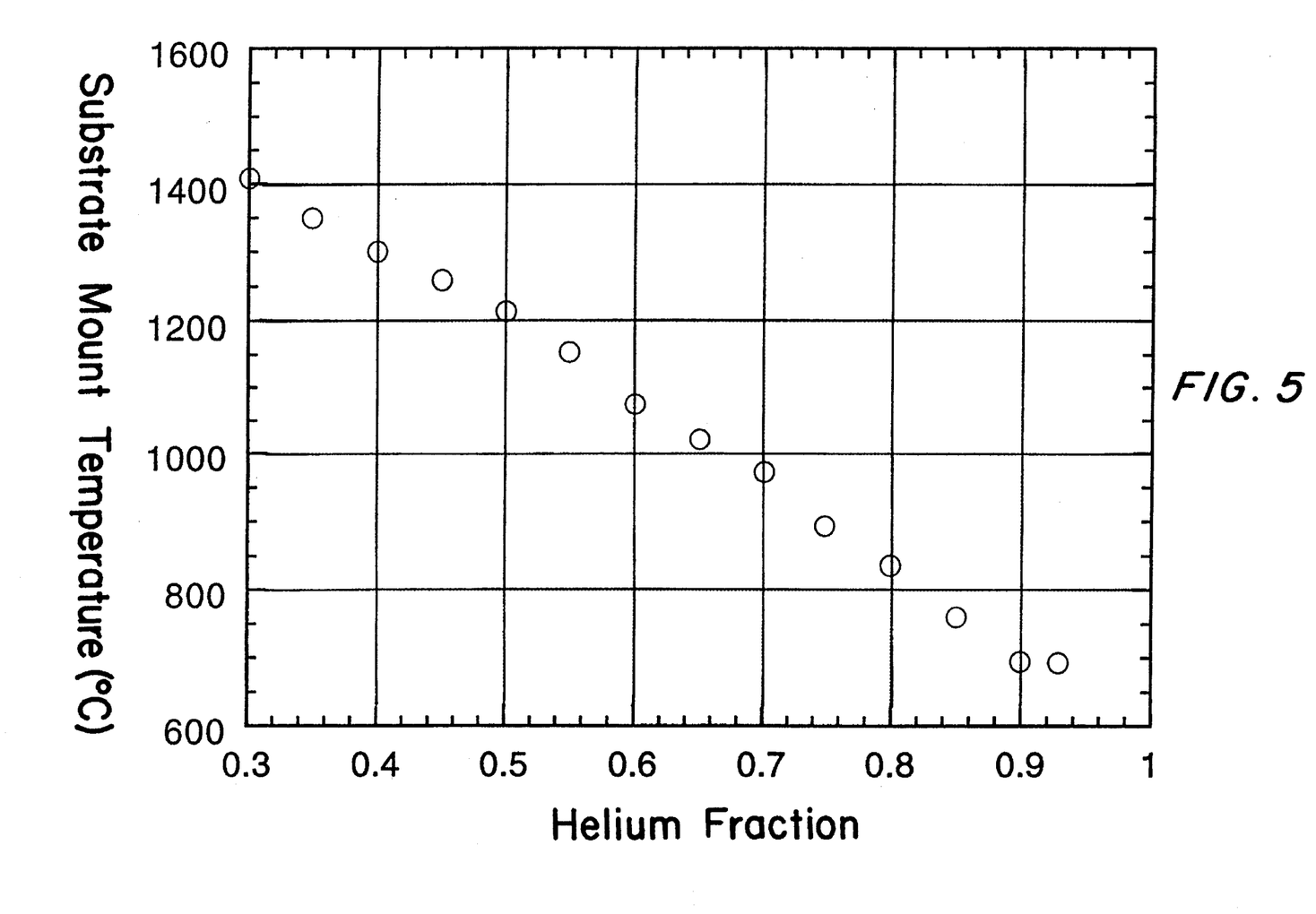
FIG. 5 is a plot of the molybdenum mount plate (substrate mount) temperature (°C.) versus helium (He) gas fraction using the second preferred embodiment of the present invention (apparatus of FIG. 3) wherein total gases consist of helium (He) and argon (Ar) and total gas flow rate was 200 sccm (standard $cm^3$/minute) through the threaded interface between the water cooled housing (substrate mount holder) and the molybdenum plate (substrate mount).
Figure 6:
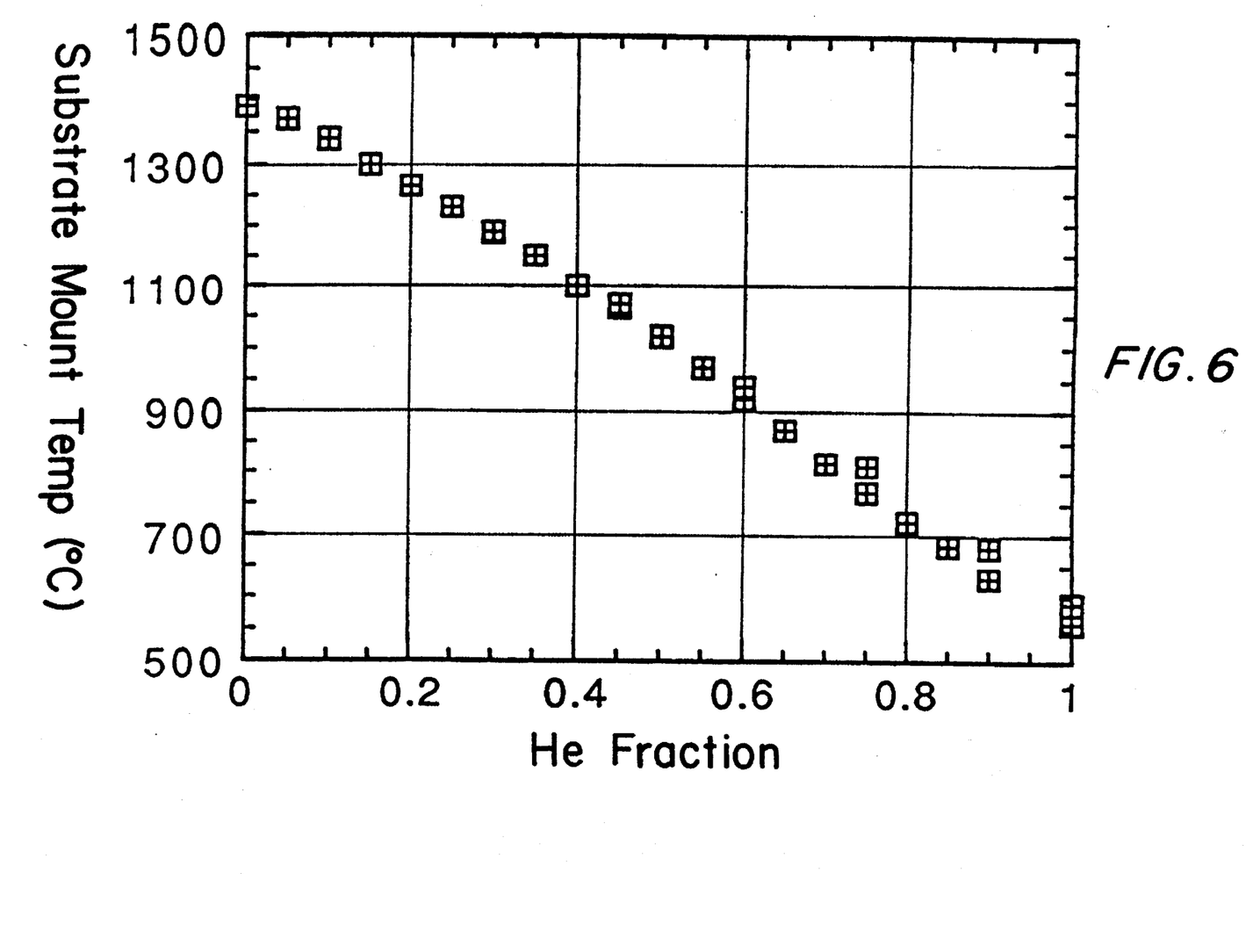
FIG. 6 is another plot of the molybdenum mount rod temperature (°C.) versus helium (He) gas fraction using the first preferred embodiment of the present invention (apparatus of FIG. 1) wherein total gases consist of helium (He) and argon (Ar) and total flow rate was 200 sccm (standard $cm^3$/minute) through the threaded interface between the water cooled housing (substrate mount holder) and the molybdenum rod (substrate mount).

When two or more gases are used, one with a high thermal conductivity relative to the other gases, one can vary the fraction of one gas to the others to obtain precise temperature control over a temperature range sufficient for growing diamond. For example, FIG. 4 and FIG. 6 illustrate the dependence of the temperature of the substrate mount rod 12 (or substrate mount disk, FIG. 5) on the helium gas fraction wherein total gases were helium and argon, in an oxygen-acetylene flame CVD reactor. From FIGS. 4, 5 and 6 it should be noted that as the gas fraction of the gas with the larger thermal conductivity, for example, helium, is increased, the temperature of the substrate is proportionately lowered. The temperature dependence of the substrate on the gas fraction of the gas with the larger thermal conductivity is a critical element of a preferred embodiment of the present invention. The precision temperature control is achieved not only by the choosing the right combination of gases but also by varying the gas fraction within the gas mixture.

In addition, the one or more gases selected, for example, 20 and 22, are gases which do not alter the growth chemistry of the desired deposition species, for example, diamond, between about 200°–2000° C. and do not react with or oxidize the substrate mount rod 12 material, the heat sink 14, and the tube material 28 sufficiently to obstruct the gas flow channel terminating at surface 24. Any one or more gases may be used which, in addition to the aforementioned non-reactivity, have sufficient thermal conductivity to allow precision temperature control of at least about ±20° C. of the substrate over a temperature of about 200°–2000° C.

In a preferred embodiment, the present invention uses a variable gas mixture of two or more gases passed through the threaded gap interface 32 to control the heat transfer between the substrate mount rod 12 and the heat sink 14. Any combination of gases may be used that is sufficiently non-reactive with tube 28, the substrate 10, the substrate mount rod 12, and the heat sink 14 and which allow precision temperature control of at least about ±20° C. of a substrate during a high heat load process such as CVD between about 200°–2000° C. Preferably, the two or more gases, for example, 20 and 22, are selected from the group consisting of argon, krypton, neon, carbon dioxide, helium, xenon and mixtures thereof.

The two or more gases released from tanks 16 and 18 into tube 28 and which flow through the threaded gap interface 32, exiting at the upper surface 24, flow at a rate sufficient to control the temperature of the substrate with the precision of at least about ±20° C. over a temperature of 200°–2000° C. The data plotted in FIG. 4, FIG. 5 and FIG. 6 was obtained wherein total gas flow rates were 200 standard cubic centimeters per minute (sccm) for each plot, respectively. While the overall size of the apparatus is determinative of the maximum gas flow rate that the apparatus can withstand, it is expected that a total gas flow rate from between about 10–1000 sccm is preferable for use in the present invention. In addition, while a helical threaded gap interface 32 is used in the first preferred embodiment illustrated in FIG. 1, the exact shape of the gap interface is not critical. Nevertheless, the gap interface should be of a sufficient size and shape to flow a gas or gases to obtain precision temperature control of the substrate of at least about ±20° C. between about 200°–2000° C. For example, a helical gap interface, a planar spiral gap interface, or a planar gap interface may be used.

In FIG. 1, the heat sink 14 is further cooled using a cooled liquid which flows through an internal cavity 38 within said heat sink 14. A thermally conductive fluid enters the internal cavity 38 of the heat sink 14 through inlet 34 and exits out of the cavity 38 through outlet 36. The fluid absorbs heat from the heat sink 14. The temperature of the heat sink 14 can be controlled by a thermally conductive cooling fluid, for example, chilled water or water at room temperature.

The heat sink 14 may be made of any material that dissipates heat at a rate which maintains the substrate at a desired temperature with the precision of about ±20° C. between 200°–2000° C. during high heat load processes. Typically, the heat sink 14 has a heat capacity, $C_p°$ (Joules/deg-mol), between about 15–50 Joules/deg-mol at 273.15° K. The intermediate and preferred ranges for the thermal conductivity of the heat sink 14 suitable for the present invention are about 1–5 W/cm-°K. and about 2–4.5 W/cm-°K., respectively, at 273° K. In addition, the heat sink 14 should be stable and unreactive with the gas or gases passed through the threaded gap interface 32, between about 15°–600° C. For example, the preferred heat sink 14 can be a copper heat sink with a heat capacity, $C_p°$, of 24.13 Joules/deg-mol at 273.15° C. and a thermal conductivity of 4.01 W/cm-°K. at 273° K.

The thermally conductive fluid is any fluid that dissipates heat at a rate which maintains the substrate temperature with the precision of at least about ±20° C. between 200°–2000° C. Typically, the thermally conductive fluid is any fluid that does not react with the heat sink 14 between about 15°–300° C. and has a heat capacity or thermal capacity, $C_p°$ (Joules/deg-mol), of between about 3–5 Joules/deg-mol at 273° K. For example, the preferred thermally conductive fluid can be water with a thermal capacity of 4.2177 Joules/deg-gm at 273° K.

In addition to the aforementioned, the temperature of the substrate 10 can be controlled by the number of threads of the substrate mount rod 12 that are exposed out of the heat sink 14 nearest the flame 30. FIG. 4 is a graph of the substrate mount rod temperature as a function of the helium gas fraction wherein total gases were helium and argon, wherein total gas flow rate was 200 standard cm³, and wherein the number of threads exposed nearest the flame 30 (See FIG. 1) are varied from 1 to 3 to 6 as indicated.

EXAMPLE 1

The layout used for controlling the temperature of the substrate mount rod 12 in a combustion assisted CVD system is described below. The precision control of the temperature of the substrate mount rod 12 (depicted in FIG. 1) achieved is demonstrated by the data obtained from such a system and disclosed in FIG. 4 and FIG. 6. In obtaining the data presented in FIG. 4 and FIG. 6, the one or more gases used were helium and argon. The total helium and argon gas mixture flow rate was controlled by two mass flow controllers (MKS model 1159) with the total flow rate fixed at 200 sccm. A small outer diameter (0.125") copper tube 28 was attached to two mass flow controllers. The gas mixture of helium and argon was injected into the copper tube 28 which was attached to a pressure fitting with an O-ring seal for a regular screwdriver. The pressure fitting connected the copper tube 28 to the molybdenum substrate mount rod 12. A screwdriver was used to adjust the degree of penetration of the molybdenum substrate mount rod 12 (⅜-24 threaded rod, 0.5" long) into the copper heat sink 14 which was water cooled and approximately 3" in diameter and 1.5" thick. The gas mixture was released from tanks 16 and 18 into tube 28 and passed through the pressure fitting into the threaded gap interface 32 sandwiched between the substrate mount rod 12 and the heat sink 14 at a constant total flow rate of 200 sccm. The individual flow rates of helium and argon were varied to alter the gas fraction of helium released from 0 to 1. While the total gas flow rate was held constant at 200 sccm, variation in the gas fraction of helium (in the mixture of helium and argon) resulted in the ability to control the temperature of the substrate mount rod 12 to within ±1°–2° C. The temperature of the substrate mount rod 12 was measured by a two color pyrometer (Williamson model 8100) which is insensitive to the flame emissions of the CVD reactor. By using a Macintosh IIx computer with the Lab View software package (National Instruments) a feedback control loop was used to maintain the temperature of the substrate mount rod 12. The results of this example are plotted in FIG. 4 and FIG. 6 wherein substrate mount rod 12 temperature is plotted against helium gas fraction wherein total gas flow rate was 200 sccm and total gases were helium and argon. In addition, the heat load in the CVD reactor was from an oxygen-acetylene flame generated with a No. 4 welder's tip in which the oxygen and acetylene gas flow rates were 10.9 and 9.06 standard liters per minute (slm), respectively.

EXAMPLE 2

Figure 3:
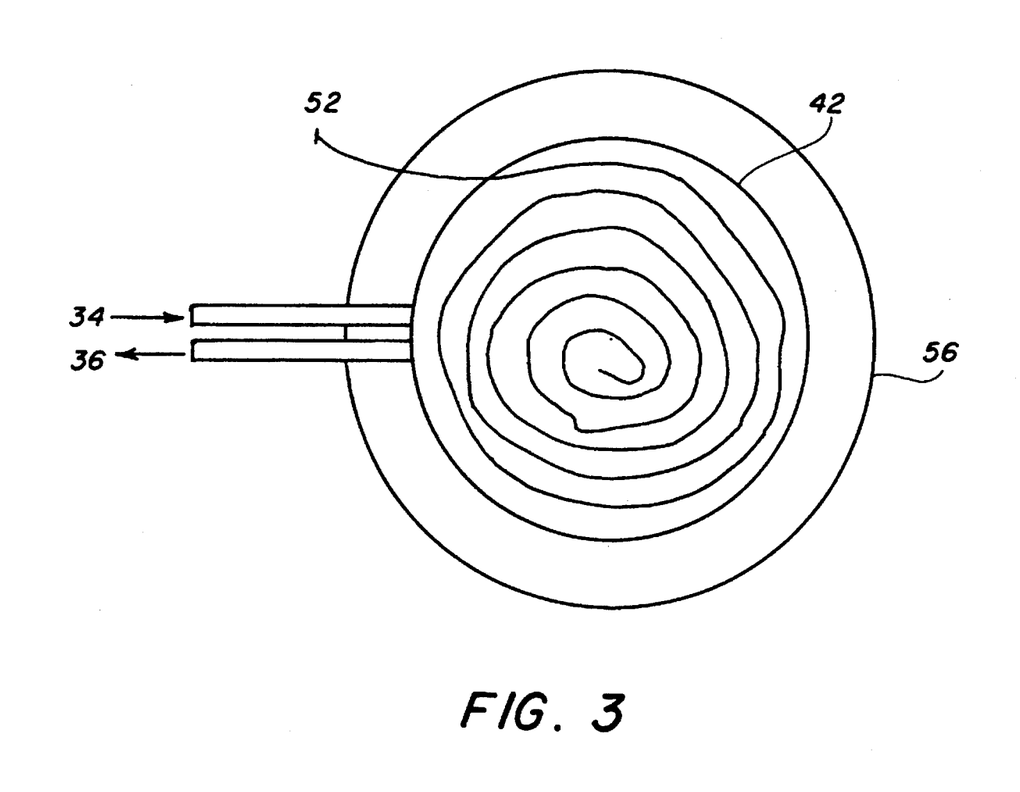
FIG. 3 is a cross-sectional view taken along the line 3—3 of the embodiment shown in FIG. 2.

Another layout used for controlling the temperature of the substrate mount disk 42 in a combustion assisted CVD system is described below. The precision control of the temperature of the substrate mount disk 42 (depicted in FIG. 2) achieved is demonstrated by the data obtained from such a system and disclosed in FIG. 5. In obtaining the data presented in FIG. 5, the one or more gases used were helium and argon. The total helium and argon gas mixture flow rate was controlled by two mass flow controllers (MKS model 1159) with the total flow rate fixed at 200 sccm. A small outer diameter (0.125") copper tube 48 was attached to two mass flow controllers. The gas mixture of helium and argon was injected into the copper tube 48 which was attached to a pressure fitting with an O-ring seal. The pressure fitting connected the copper tube 48 to the molybdenum substrate mount disk 42. The molybdenum substrate mount disk 42 had a diameter of 1" and a thickness of 5/16". In addition, a gap interface channel between the heat sink 44 and the substrate mount disk 42 is carved out on the underside of the substrate mount disk 42 in the shape of a planar spiral as shown in FIG. 3 and referred to as 52. Though not shown, the remainder of the apparatus is the same as that depicted in FIG. 1. As in FIG. 1, the gas mixture was released from tanks 16 and 18 into tube 48 and passed through the pressure fitting into the spiral gap interface 52 sandwiched between the substrate mount disk 42 and the heat sink 44 at a constant total flow rate of 200 sccm. The individual flow rates of helium and argon were varied to alter the gas fraction of helium released from 0 to 1. While the total gas flow rate was held constant at 200 sccm, variation in the gas fraction of helium (in the mixture of helium and argon) resulted in the ability to control the temperature of the substrate mount disk 42 to within ±1°–2° C. The temperature of the substrate mount disk 42 was measured by a two color pyrometer (Williamson model 8100) which is insensitive to the flame emissions of the CVD reactor. By using a Macintosh IIx computer with the Lab View software package (National Instruments) a feedback control loop was used to maintain the temperature of the substrate mount disk 42. The results of this example are plotted in FIG. 5 wherein substrate mount disk 42 temperature is plotted against helium gas fraction wherein total gas flow rate was 200 sccm and total gases were helium and argon. In addition, the heat load in the CVD reactor was from an oxygen-acetylene flame generated with a No. 4 welder's tip in which the oxygen and acetylene gas flow rates were 10.0 and 9.19 standard liters per minute (slm), respectively.

What is claimed is:

1. An apparatus for the chemical vapor deposition of a deposition species onto a substrate comprising:

a substrate having an upper surface upon which said chemical vapor deposition species is deposited;

a means for controlling the temperature of said upper surface of said substrate to a precision of at least ±20° C. of a target temperature within a temperature range of about 200°–2000° C. using two or more gases, said gases further comprising a first gas having a first thermal conductivity and a first mole fraction and a second gas having a second thermal conductivity and a second mole fraction wherein a difference between said first and second thermal conductivities is sufficient to control said temperature to within said precision;

a means for supplying said first gas;

a means for supplying said second gas;

a means for mixing said first and said second gases; and a means for varying said first and second mole fractions to control said temperature to within said precision.

2. The apparatus of claim 1, wherein said means for controlling the temperature of said upper surface of said substrate comprises:

a substrate mount for supporting said upper surface of said substrate;

a heat sink;

a gap interface between said substrate mount and said heat sink, said gap interface defining a channel through which one or more gases may flow; and a flow means for flowing said one or more gases through said channel.

3. The apparatus of claim 1, wherein said means for controlling the temperature of said upper surface of said substrate controls the temperature of said upper surface of said substrate to a precision of at least about ±1° C. within a temperature range of about 200°–2000° C.

4. The apparatus of claim 2, wherein said substrate mount is made of a refractory material.

5. The apparatus of claim 2, wherein said substrate mount is made of materials having a thermal conductivity between about 0.05–32 W/cm-°K. at 273° K.

6. The apparatus of claim 2, wherein said substrate mount is made of materials having a thermal conductivity between about 0.6–32 W/cm-°K. at 273° K.

7. The apparatus of claim 2, wherein said substrate mount is made of materials having a thermal conductivity between about 1.0–32 W/cm-°K. at 273° K.

8. The apparatus of claim 2, wherein said substrate mount is made of materials selected from the group consisting of graphite, molybdenum, sapphire, diamond, alumina, tungsten, titanium, niobium, beryllium oxide and mixtures thereof.

9. The apparatus of claim 2, wherein said heat sink is selected from the group consisting of a spray cooler, a closed loop heat transfer oil system and an internally fluid cooled substrate mount housing.

10. The apparatus of claim 9, wherein said heat sink is an internally fluid cooled substrate mount housing.

11. The apparatus of claim 10, wherein said substrate mount housing is made of materials having a thermal conductivity between about 15–50 Joules/deg-mol at 273.15° K.

12. The apparatus of claim 2, wherein said channel is helical.

13. The apparatus of claim 2, wherein said channel defines a planar spiral.

14. The apparatus of claim 2, wherein said channel defines a planar gap.

15. The apparatus of claim 2, wherein said flow means is adapted for flowing said one or more gases through said channel at between about 10–1000 standard cubic centimeters per minute.

16. The apparatus of claim 9, wherein said fluid has a heat capacity of about 3–5 Joules/deg-mol at 273° K.

17. The apparatus of claim 9, wherein said fluid is water.

18. The apparatus of claim 2, wherein said one or more gases are essentially non-reactive with said deposition species, said substrate, said substrate mount and said heat sink.

19. The apparatus of claim 2, wherein said flow means is adapted to flow a mixture of gases through said channel.

20. The apparatus of claim 19, wherein said mixture of at least two gases is selected from the group consisting of argon, krypton, neon, carbon dioxide, nitrogen, helium, xenon, hydrogen and mixtures thereof.

21. The apparatus of claim 1, wherein said means for controlling the temperature of said upper surface of said substrate controls the temperature of said upper surface of said substrate to a precision of at least about ±10° C. within a temperature range of about 200°–2000° C.

22. The apparatus of claim 1, wherein said means for controlling the temperature of said upper surface of said substrate controls the temperature of said upper surface of said substrate to a precision of at least about ±5° C. within a temperature range of about 200°–2000° C.

23. The apparatus of claim 1, wherein said means for controlling the temperature of said upper surface of said substrate controls the temperature of said upper surface of said substrate to a precision of at least about ±2° C. within a temperature range of about 200°–2000° C.

24. An apparatus for the chemical vapor deposition of a deposition species onto a substrate mount, said apparatus comprising:

a substrate mount having an upper surface upon which said deposition species is deposited, said deposition species forming an exposed upper surface upon deposition of said deposition species on said upper surface of said substrate mount;

a means for controlling the temperature of said exposed upper surface of said deposition species to a precision of at least ±20° C. of a target temperature within a temperature range of about 200°–2000° C. using two or more gases, said gases further comprising a first gas having a first thermal conductivity and a first mole fraction and a second gas having a second thermal conductivity and a second mole fraction wherein a difference between said first and second thermal conductivities is sufficient to control said temperature to within said precision;

a means for supplying said first gas;

a means for supplying said second gas;

a means for mixing said first and said second gases; and a means for varying said first and second mole fractions to control said temperature to within said precision.

* * * * *